US007320830B2

(12) United States Patent
Itou et al.

(10) Patent No.: US 7,320,830 B2

(45) Date of Patent: Jan. 22, 2008

(54) FLAME-RETARDANT HEAT-RESISTANT RESIN COMPOSITION AND ADHESIVE FILM COMPRISING THE SAME

(75) Inventors: Toshihiko Itou, Ibaraki (JP); Masaru Tanaka, Yuki (JP); Shigehiro Nakamura, Ibaraki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 460 days.

(21) Appl. No.: 10/488,687

(22) PCT Filed: Sep. 2, 2002

(86) PCT No.: PCT/JP02/08875

§ 371 (c)(1), (2), (4) Date: Sep. 27, 2004

(87) PCT Pub. No.: WO03/022929

PCT Pub. Date: Mar. 20, 2003

(65) Prior Publication Data

US 2005/0054776 A1 Mar. 10, 2005

(30) Foreign Application Priority Data

Sep. 5, 2001 (JP) ............................ 2001-269141
May 13, 2002 (JP) ............................ 2002-137309

(51) Int. Cl.

| | |
|---|---|
| ***B32B 27/34*** | (2006.01) |
| ***B32B 27/38*** | (2006.01) |
| ***C08L 63/00*** | (2006.01) |
| ***C08L 77/10*** | (2006.01) |
| ***C08L 79/08*** | (2006.01) |

(52) U.S. Cl. ............................ 428/473.5; 428/355 EP; 428/413; 428/474.4; 523/451; 525/423; 525/533

(58) Field of Classification Search .......... 428/355 EP, 428/413, 414, 473.5, 474.4; 523/400, 451; 525/418, 419, 420, 421, 422, 423, 425, 523, 525/529, 530, 533

See application file for complete search history.

(56) References Cited

FOREIGN PATENT DOCUMENTS

| | | |
|---|---|---|
| JP | 10-338747 | 12/1998 |
| JP | 11-217503 | 8/1999 |
| JP | 11-263840 | 9/1999 |
| JP | 2000-345035 | 12/2000 |
| JP | 2001-139809 | 5/2001 |
| JP | 2001-152016 | 6/2001 |
| JP | 2002-161205 | 6/2002 |
| KR | 1993-0007700 | 8/1993 |

OTHER PUBLICATIONS

Machine translation of JP 2002-161205, provided by the JPO website.*

Machine translation of JP 2001-139809, provided by the JPO website.*

Official Action dated Feb. 20, 2007, for JP 2003-526998.

* cited by examiner

*Primary Examiner*—Michael J. Feely

(74) *Attorney, Agent, or Firm*—Antonelli, Terry, Stout & Kraus, LLP.

(57) ABSTRACT

The present invention provides a non-flammable heat-resistant resin composition that is provided with (A) modified polyamideimide resin, (B) thermosetting resin and (C) organic phosphor-based compound, and a cured film, obtained from the non-flammable heat-resistant resin composition, exerts a storage elastic modulus of 700 MPa or less, a coefficient of thermal expansion of $5\times10^{-3}$/K or less and an internal stress of 20 MPa or less, in a temperature range of 25 to 250° C., and the present invention also relates to an adhesive film using the resin composition.

24 Claims, No Drawings

FLAME-RETARDANT HEAT-RESISTANT RESIN COMPOSITION AND ADHESIVE FILM COMPRISING THE SAME

FIELD OF THE INVENTION

The present invention relates to a non-flammable heat-resistant resin composition that has superior thermal-stress reducing effects, and is effectively used for adhesives for various printed circuit boards, adhesive films and the like, and also concerns an adhesive film using such a resin composition.

BACKGROUND OF THE INVENTION

In recent years, along with the developments of various small-size, lightweight electronic apparatuses, the packaging density of electronic parts becomes higher, and there have been various demands for characteristics required for various electronic parts and materials to be used in these apparatuses. In particular, with respect to printed circuit boards, the circuit occupied area becomes smaller, and comes to have a higher density, and there have been increasing demands for multi-layer circuit boards (built-up circuit boards), flexible wiring boards (FPC) and the like. With respect to these circuit boards, various adhesives and adhesive films are used in manufacturing processes thereof, and with respect to resins to be used for the adhesives, epoxy resins, acrylic resins and the like are mainly used. However, none of these resins sufficiently satisfy characteristics such as heat resistance and electrical insulating property.

Here, adhesives made from polyimide resins and polyamideimide resins have been known as adhesives having superior heat resistance and electrical insulating property; however, these adhesives have a problem in that a thermal stress is generated between a coated member and the adhesive due to thermal history during circuit board manufacturing processes to cause warping in the resulting wiring circuit board.

Conventionally, with respect to the non-flammable agent for materials for various printed circuit boards, halogen-based compounds and antimony-based compounds, such as brome-based compounds, having superior non-flammable effects have been generally used. However, with respect to the halogen-based compounds, recent researches have implied the possibility of generating gases containing dioxin and the like highly toxic to the human body, upon burning, and the application thereof has been limited centered on European countries. With respect to substitutes for such non-flammable agents, well-known specific examples include inorganic fillers, such as aluminum hydroxide and magnesium hydroxide, and non-flammable agents such as phosphor-based compounds.

However, with respect to these compounds, in order to obtain a sufficient non-flammable property, a great amount thereof needs to be added to a target resin, with the result that the inherent characteristics of the resin tend to deteriorate greatly. More specifically, it has been known that, for example, in an FPC-use adhesive among various circuit-board-use adhesives, due to soluble sodium mixed therein upon production, aluminum hydroxide tends to cause a hydrolytic reaction on the surface of a polyimide film that is a coated member, when subjected to a long-time high-temperature, high-humidity process, to weaken the surface of the polyimide film to cause degradation in the peeling strength. Moreover, it has been generally known that magnesium hydroxide causes degradation in acid resistance. Furthermore, phosphates, which have been well known materials among phosphor-based compounds, function as a plasticizer to cause degradation in the heat resistance and the like; therefore, it is necessary to limit the kinds and added amounts thereof.

SUMMARY OF THE INVENTION

An objective of the present invention is to provide a non-flammable heat-resistant resin composition which exerts superior thermal-stress-reducing effects, and is effectively used for adhesives for various printed circuit boards and adhesive films. Moreover, another objective thereof is to provide a non-flammable heat-resistant resin composition which has a superior halogen-free non-flammable property derived from a phosphor-based compound serving as a non-flammable assistant agent, and a superior adhesive property derived from a modified polyamideimide resin, and is effectively used for various printed-circuit-use adhesives and adhesive films.

Still another objective of the present invention is to provide an adhesive film which has superior halogen-free heat resistant property and non-flammable property, and also has a superior adhesive property derived from a modified polyamideimide resin, and is effectively used for various printed circuit boards.

In other words, the present invention relates to a non-flammable heat-resistant resin composition that contains (A) modified polyamideimide resin, (B) thermosetting resin and (C) organic phosphor-based compound, and the cured film, obtained from the composition, exerts a storage elastic modulus of 700 MPa or less, a coefficient of thermal expansion of $5\times10^{-3}$/K or less and an internal stress of 20 MPa or less, in a temperature range of 25 to 250° C.

Moreover, the present invention also relates to the above-mentioned non-flammable heat-resistant resin composition in which: the modified polyamideimide resin of (A) component is synthesized in the presence of a non-protic polar solvent, and resin varnish containing this solvent is dried at 120 to 140° C. for 5 to 15 minutes so that the content of the non-protic polar solvent becomes 1% or less.

Furthermore, the present invention relates to the above-mentioned non-flammable heat-resistant resin composition which contains 10 to 100 parts by weight of the thermosetting resin of (B) component and 2 to 20 parts by weight of the organic phosphor-based compound of (C) component, with respect to 100 parts by weight of the modified polyamideimide resin of (A) component.

In the present invention, the modified polyamideimide resin of (A) component is a modified polyamideimide resin that is obtained by allowing a mixture containing diimide dicarboxylic acid, represented by the following formula 1, formula 2 and formula 3 obtained through a reaction between a mixture of diamine having three or more aromatic rings, polyoxypropylene diamine and siloxane diamine, and trimellitic anhydride;

(Formula 1)

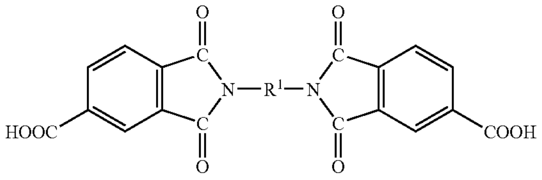

[in the formula, $R^1$ represents:

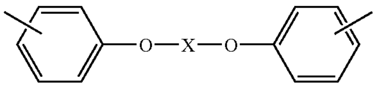

(where X represents

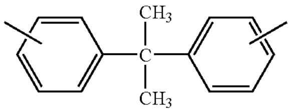
,
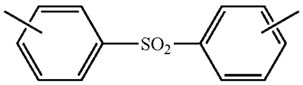
,
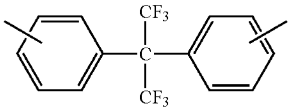
,
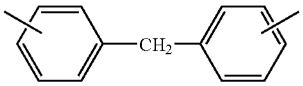
,
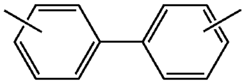
,
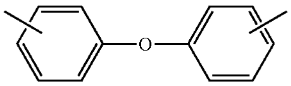
,
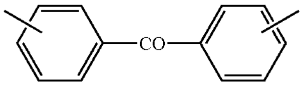
or
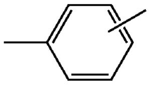
)]

(Formula 2)

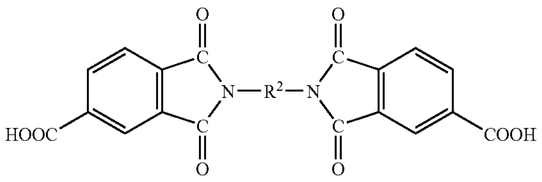

[in the formula, $R^2$ represents:

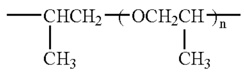

(where n represents an integer of 1 to 70).]

(Formula 3)

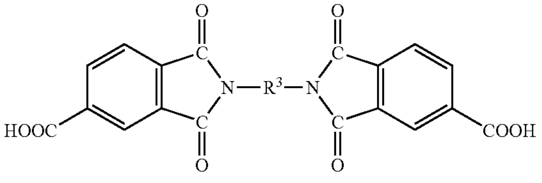

[in the formula, $R^3$ represents:

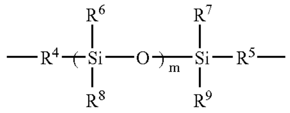

(where $R^4$ and $R^5$ independently represent divalent organic groups, each of $R^6$ to $R^9$ independently represents an alkyl group having 1 to 20 carbon atoms or an aryl group having 6 to 18 carbon atoms, and m represents an integer of 1 to 50)]

and aromatic dicarboxylic acid represented by the following formula 4 to coexist;

$HOOC—R^{10}—COOH$ (Formula 4)

[in the formula, $R^{10}$ represents:

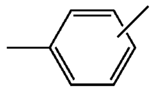
,
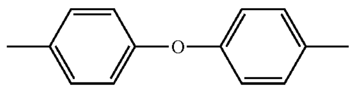
,
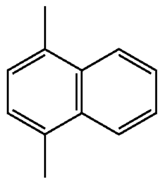
,
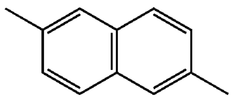
]

and by also allowing aromatic diisocyanate represented by the following formula 5 to react with the mixture.

$NCO—R^{11}—NCO$ (Formula 5)

[in the formula, $R^{11}$ represents:

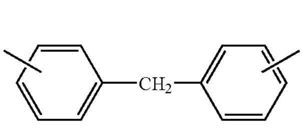

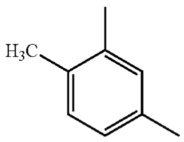

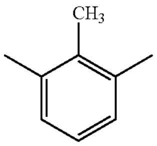

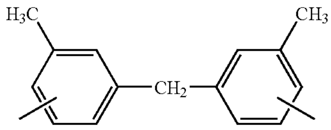

or

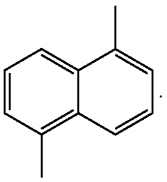

.

Moreover, the present invention relates to the above-mentioned non-flammable heat-resistant resin composition in which the modified polyamideimide resin component (A) is synthesized in the presence of a basic catalyst, and the basic catalyst is trialkyl amine represented by the following formula 6.

(formula 6)

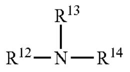

(in the formula, each of $R^{12}$ to $R^{14}$ represents an alkyl group having 1 to 8 carbon atoms.)

Further, the present invention relates to the above-mentioned non-flammable heat-resistant resin composition in which the amine equivalent weight of polyoxypropylene diamine is set in a range from 100 to 2,000 g/mol.

Moreover, the present invention relates to the above-mentioned non-flammable heat-resistant resin composition in which the amine equivalent weight of siloxane diamine is set in a range from 400 to 2,500 g/mol.

Furthermore, the present invention relates to the above-mentioned non-flammable heat-resistant resin composition in which the thermosetting resin component (B) is made from an epoxy resin and a curing accelerator thereof or a curing agent thereof.

Here, the present invention also relates to the above-mentioned non-flammable heat-resistant resin composition in which the epoxy resin is a phosphor-containing epoxy resin.

Further, the present invention relates to the above-mentioned non-flammable heat-resistant resin composition in which the organic phosphor-based compound (C) is a phosphate-based compound represented by the following formula 7, (Formula 7)

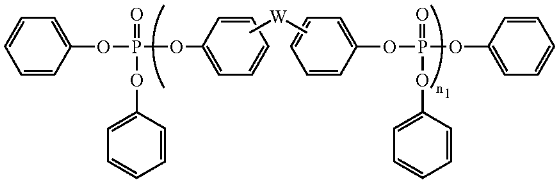

(in the formula, W represents a single bond, or a bonding group, such as an alkylene group having 1 to 5 carbon atoms, —S—, —$SO_2$—, —O—, or —N═N—, and $n_1$ is an integer of 10 to 50) or a phosphate-based compound represented by the following formula formula 8.

(Formula 8)

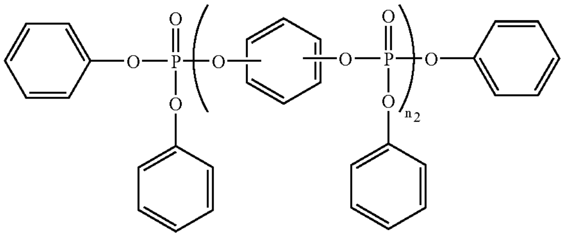

(in the formula, $n_2$ is an integer of 10 to 50)

Moreover, the present invention relates to an adhesive film having at least the above-mentioned non-flammable heat-resistant resin composition and a supporting member for supporting the resin composition, and the supporting member is preferably made of a polyimide film.

This application claims benefit of priority to Japanese patent applications No. 2001-269141 (filing date: Sep. 5, 2001) and No. 2002-137309 (filing date: May 13, 2002), previously applied by the same applicant as the present application, the specifications of which are incorporated by reference herein.

DETAILED DESCRIPTION OF THE INVENTION

The non-flammable heat-resistant resin composition of the present invention contains (A) modified polyamideimide resin, (B) thermosetting resin and (C) organic phosphor-based compound.

Moreover, a cured film, obtained from the above-mentioned non-flammable heat-resistant resin composition, exerts a storage elastic modulus of 700 MPa or less, preferably, from 50 to 600 MPa, a coefficient of thermal expansion of $5\times10^{-3}$/K or less, preferably, $4\times10^{-3}$/K to $0.2\times10^{-3}$/K, and an internal stress of 20 MPa or less, preferably, 1 to 18 MPa, in a temperature range of 25 to 250° C. Here, the glass transition temperature (Tg) thereof is preferably set in a range from 25 to 250° C., more preferably, from 50 to 230° C., most preferably, from 100 to 200° C.

In the case when the storage elastic modulus exceeds 700 MPa, the coefficient of thermal expansion exceeds $5\times10^{-3}$/K and the internal stress exceeds 20 MPa, it becomes difficult to reduce warping by alleviating the stress. Here, in the present invention, the storage elastic modulus is measured by a dynamic viscoelasticity measuring device (DMA). The coefficient of thermal expansion is measured by a thermal mechanical analyzer (TMA). The internal stress ($\sigma$) is found from the following equation based upon the coefficient of thermal expansion ($\alpha$), the storage elastic modulus (E) and the glass transition temperature (Tg).

$$\sigma=\alpha_1 E_1(Tg-Tg_1)+\alpha_2 E_2(Tg_2-Tg)$$

Here, $\alpha_1$ represents a coefficient of thermal expansion at temperatures lower than Tg, and $\alpha_2$ represents a coefficient of thermal expansion at temperatures higher than Tg. Moreover, $E_1$ represents a storage elastic modulus at temperatures lower than Tg, and $E_2$ represents a storage elastic modulus at temperatures higher than Tg. Further, $Tg_1$ is a predetermined set temperature lower than Tg, and $Tg_2$ is a predetermined set temperature higher than Tg.

Additionally, these physical properties can be measured by using a cured film obtained by the non-flammable heat-resistant resin composition of the present invention. With respect to the forming conditions of the cured film, although not particularly limited, for example, the cured film, obtained through a curing process at 180° C. for 2 hours, may be used for the measurements.

The modified polyamideimide resin of (A) component is a polyamideimide resin that is preferably obtained by allowing: a mixture containing diimide dicarboxylic acid represented by the above-mentioned formula 1, formula 2 and formula 3 obtained through a reaction between a mixture of diamine having three or more aromatic rings, polyoxypropylene diamine and siloxane diamine, and trimellitic anhydride; aromatic dicarboxylic acid represented by the following formula 4; and aromatic diisocyanate represented by the following formula 5 to react with one another by using a basic catalyst represented by the above-mentioned formula 6.

In the above-mentioned formula 3, with respect to the alkyl group having 1 to 20 carbon atoms, examples thereof include: a methyl group, an ethyl group, an n-propyl group, an isopropyl group, an n-butyl group, an isobutyl group, a sec-butyl group, a tert-butyl group, a pentyl group, an isopentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and icocyl group and structural isomers of these.

In the above-mentioned formula 3, with respect to the aryl group having 6 to 18 carbon atoms, examples thereof include: a phenyl group, a naphthyl group, an anthoryl group and a phenantholyl group, and these may be substituted by a halogen atom, an amino group, a nitro group, a cyano group, a mercapto group, an allyl group, an alkyl group having 1 to 20 carbon atoms or the like.

With respect to the diamine having three or more aromatic rings, examples thereof include:

2,2-bis[4-(4-aminophenoxy)phenyl]propane (hereinafter, sometimes referred to simply as BAPP),
bis[4-(3-aminophenoxy)phenyl]sulfone,
2,2-bis[4-(4-aminophenoxy)phenyl]hexafluoropropane,
bis[4-(4-aminophenoxy)phenyl]methane,
4,4'-bis(4-aminophenoxy)biphenyl,
bis[4-(4-aminophenoxy)phenyl]ether,
bis[4-(4-aminophenoxy)phenyl]ketone,
1,3-bis(4-aminophenoxy)benzene,
1,4-bis(4-aminophenoxy)benzene, and from the viewpoints of balance of characteristics and costs of the modified polyamideimide resin, 2,2-bis[4-(4-aminophenoxy)phenyl]propane is more preferably used. These may be used alone or two or more kinds of these may be used in combination.

With respect to polyoxypropylene diamine to be used in the present invention, known compounds may be used, and for example, compounds represented by the following formula 9 are preferably used:

(Formula 9)

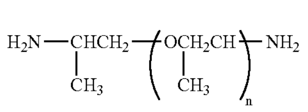

(where n is an integer of 1 to 70).

Commercially available products thereof include: Jeffermine D-230 (amine equivalent 115 g/mol), Jeffermine D-400 (amine equivalent 200 g/mol), Jeffermine D-2000 (amine equivalent 1,000 g/mol) and Jeffermine D-4000 (amine equivalent 2,000 g/mol) (trade names of Sun Technochemical Co., Ltd.). These may be used alone or two or more of these may be used in combination.

Here, in order to allow the modified polyamideimide resin of (A) component to reduce the thermal stress that causes warping and improve the adhesiveness, the amine equivalent weight of polyoxypropylene diamine is preferably set in a range from 100 to 2,000 g/mol, preferably, from 200 to 2,000 g/mol, more preferably, from 1,000 to 2,000 g/mol. Examples thereof include Jeffermine D-2000 (amine equivalent weight: 1,000 g/mol), Jeffermine D-4000 (amine equivalent weight: 2,000 g/mol) (trade names: made by Sun Technochemical Co., Ltd.), and the like. These may be used alone or two kinds or more of these may be used in combination. Here, in the present invention, the amine equivalent weight refers to the number of grams of a resin that contains 1 mol of amino groups.

With respect to siloxane diamine to be used in the present invention, those of conventionally known compounds may be used, and, for example, the compound represented by the following formula 10 is preferably used:

(Formula 10)

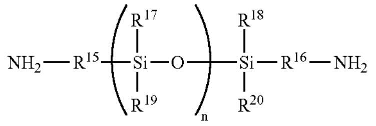

(in the formula, $R^{15}$ and $R^{16}$ independently represent divalent organic groups, $R^{17}$ to $R^{20}$ are independently defined in the same manner as $R^6$ to $R^9$ in the above-mentioned formula 3, and n represents an integer of 1 to 50.)

In the above-mentioned formula (formula 10), with respect to the divalent organic group, examples thereof include: alkylene groups such as a methylene group, an ethylene group and a propylene group, and arylene groups such as a phenylene group, a tolylene group and a xylylene group, and the arylene group may have a substituent such as an alkyl group.

With respect to siloxane diamine of this type, those represented by the following formulas are listed:

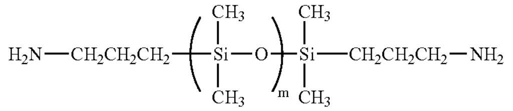

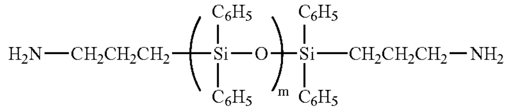

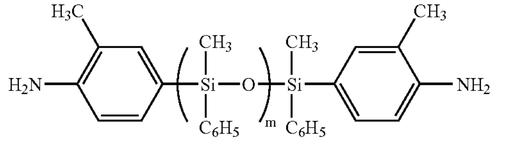

[in the formulas, m represents an integer of 1 to 50.]

Examples of those commercially available include amino-modified silicone oils, which are siloxane-based diamines having amine groups on two ends: X-22-161AS (amine equivalent weight: 450 g/mol), X-22-161-A (amine equivalent weight: 840 g/mol) and X-22-161-B (amine equivalent weight: 1540 g/mol) (trade names, made by Shin-Etsu Chemical Co., Ltd.) and the like, and BY16-853 (amine equivalent weight: 650 g/mol), BY16-853B (amine equivalent weight: 2200 g/mol) (trade names, made by Dow Corning Toray Silicone Co., Ltd.) and the like. These may be used alone, or two or more kinds of these may be used in combination.

Here, in order to impart a non-flammable property to the modified polyamideimide resin of (A) component and to improve the adhesiveness, the amine equivalent weight of siloxane diamine is preferably set in a range from 400 to 2,500 g/mol, more preferably, from 800 to 2,500 g/mol, most preferably, from 800 to 1,600 g/mol. Examples of these include X-22-161A (amine equivalent weight: 840 g/mol), X-22-161B (amine equivalent weight: 1540 g/mol) (trade names, made by Shin-Etsu Chemical Co., Ltd.) and the like. These may be used alone, or two or more kinds of these may be used in combination.

With respect to aromatic dicarboxylic acid represented by the above-mentioned formula 4, examples thereof include: terephthalic acid, isophthalic acid, 1,4-naphthalene dicarboxylic acid and 2,6-naphthalene dicarboxylic acid, from the viewpoints of improving the aligning property of polymer, the film-forming property and the heat resistance thereof, terephthalic acid is preferably used. These may be used alone, or two or more kinds of these may be used in combination. Moreover, aliphatic dicarboxylic acid, such as adipic acid, sebacic acid, decanoic diacid and dodecanoic diacid, may be added to the above-mentioned aromatic dicarboxylic acid at a rate of 5 to 10 mol %.

With respect to the aromatic diisocyanate represented by the above-mentioned formula 5, examples thereof include: 4,4'-diphenylmethane diisocyanate (hereinafter, sometimes referred to simply as MDI), 2,4-tolylenediisocyanate (hereinafter, sometimes referred to simply as TDI), 2,6-tolylenediisocyanate, naphthalene-1,5-diisocyanate, 2,4-tolylene dimer, and the like, and from the viewpoints of imparting flexibility and of preventing crystalline property, 4,4'-diphenylmethane diisocyanate is preferably used. These may be used alone, or two or more kinds of these may be used in combination.

Moreover, from the viewpoint of heat resistance, aliphatic diisocyanate, such as hexamethylene diisocyanate, 2,2,4-trimethylhexamethylene diisocyanate and isophoronediisocyanate, may be used at a rate of 5 to 10 mol % in combination with the above-mentioned aromatic diisocyanate.

With respect to the basic catalyst represented by the above-mentioned formula 6, examples thereof include: trimethyl amine, triethyl amine, tripropyl amine, tri(2-ethylhexyl)amine and trioctyl amine, and triethyl amine, which accelerates the polymerization reaction, and is easily removed, is preferably used.

The modified polyamideimide resin of (A) component to be used in the present invention is prepared by, for example, the following processes: diamine (1') having three or more aromatic rings, polyoxypropylene diamine (2') and siloxane diamine (3'), as well as trimellitic anhydride (hereinafter, referred to simply as TMA), are allowed to react with one another at 160° C. for two hours in the presence of a non-protic polar solvent and aromatic hydrocarbon (at a weight ratio of 0.1 to 0.5 with respect to the non-protic polar solvent) capable of azeotropic distillation together with water; thus, a mixture containing aromatic diimide dicarboxylic acid (1) represented by the above-mentioned formula formula 1, polyoxypropylene diimide dicarboxylic acid (2) represented by the above-mentioned formula 2 and siloxane diimide dicarboxylic acid (3) represented by the above-mentioned formula 3 is prepared, and this mixture is allowed to react with aromatic dicarboxylic acid (4) represented by the above-mentioned formula 4 and aromatic diisocyanate (5) represented by the above-mentioned formula 5 at 190° C. for two hours.

Moreover, after the mixture containing diimide carboxylic acids represented by the above-mentioned formula formula 1, formula 2 and formula 3 has been prepared, the resulting solution is heated to 160 to 190° C. so that the aromatic hydrocarbon capable of azeotropic distillation together with water is removed therefrom, and aromatic dicarboxylic acid is added thereto to allow this to react with aromatic diisocyanate; thus, the modified polyamideimide resin of (A) component is also obtained. Here, the modified polyamideimide resin is preferably prepared as varnish containing a non-protic polar solvent.

With respect to a ratio of blending of the mixture of diamine (1') having three or more aromatic rings, polyoxypropylene diamine (2') and siloxane diamine (3'), the ratio is preferably set to (1')/(2')/(3')=(0 to 70.0)/(10.0 to 70.0)/(10.0 to 50.0)(in which the unit of the respective values is mole % and the total of (1')(2') and (3') is 100 mole %), and a resin obtained by using a mixture having a ratio out of this range tends to cause warping, or degradation in the non-flammable property, or disappearance of the micro phase separation structure, or a reduction in the molecular weight. The range of the ratio is more preferably set to (0 to 65.0)/(20.0 to 60.0)/(10.0 to 40.0)(mole %).

Moreover, the amounts of materials to be used for allowing the above-mentioned mixture to react with trimellitic anhydride (TMA) to obtain a mixture containing diimidedicarboxylic acids represented by the above-mentioned formula 1, formula 2 and formula 3 are set in the following manner: the mole ratio between the total number of moles of diamine (1') having three or more aromatic rings, polyoxypropylene diamine (2') and siloxane diamine (3') and the number of moles of TMA, that is, ((1')+(2')+(3'))/TMA, is preferably set in a range from 1/2.05 to 1/2.20, more preferably, from 1/2.10 to 1/2.15. When the mole ratio is less than 1/2.20, TMA tends to remain, causing a reduction in the molecular weight of the finally obtained resin; in contrast, when the mole ratio exceeds 1/2.05, diamine tends to remain, causing a reduction in the molecular weight of the finally obtained resin.

Moreover, the mole ratio between the total number of moles of diimidedicarboxylic acids represented by the above-mentioned formula 1, formula 2 and formula 3, and the number of moles of aromatic dicarboxylic acid represented by the above-mentioned formula 4, that is, ((1)+(2)+(3))/(4), is preferably set in a range from 1.0/0 to 1.0/1.2, more preferably, from 1.0/0 to 1.0/1.1. When the mole ratio exceeds 1.0/1.2, the resulting resin tends to have a higher modulus of elasticity.

Next, in order to allow a mixture (1)+(2)+(3)+(4) containing diimide dicarboxylic acids represented by the above-mentioned formula 1, formula 2, formula 3 and aromatic dicarboxylic acid, and aromatic diisocyanate represented by the above-mentioned formula (5) to react with one another to obtain a modified polyamideimide resin, the mole ratio ((1)+(2)+(3)+(4))/(5) is preferably set in a range from 1/1.50 to 1/1.05, more preferably, from 1/1.30 to 1/1.10. In the case of the mole ratio of less than 1/1.50, the resulting resin tends to have a reduction in the molecular weight, and in the case of the mole ratio exceeding 1/1.05, the resulting resin also tends to have a reduction in the molecular weight.

The non-protic polar solvent is preferably an organic solvent which is not capable of reacting with diamine having three or more aromatic rings, polyoxypropylene diamine, siloxane diamine and TMA, and specific examples are: dimethyl acetamide, dimethyl formamide, dimethyl sulfoxide, N-methyl-2-pyrrolidone, γ-butyrolactone, sulforan and cyclohexanone. Since the imidizing reaction requires a high temperature, N-methyl-2-pyrrolidone having a high boiling point is preferably used. These may be used alone, or two or more kinds of these may be used in combination.

The moisture content contained in each of these non-protic polar solvents is preferably set in a range from 0.1 to 0.2% by weight. In the case of the moisture content exceeding 0.2% by weight, the reaction is not allowed to sufficiently progress due to trimellitic acid generated through hydration of TMA, with the result that the molecular weight of the resin tends to be lowered. Moreover, in the present invention, the used amount of non-protic polar solvent is preferably set in a range from 10 to 80% by weight, more preferably, from 50 to 80% by weight, with respect to the total amount of diamine having three or more aromatic rings, polyoxypropylene diamine, siloxane diamine and TMA. Here, the used amount of less than 10% by weight tends to cause degradation in the solubility of TMA, failing to carry out a sufficient reaction, while the used amount exceeding 80% by weight tends to cause adverse effects as the industrial manufacturing method.

With respect to the aromatic hydrocarbon capable of azeotropic distillation with water, examples thereof include toluene and xylene.

The weight average molecular weight of the modified polyamideimide resin of (A) component is preferably set in a range from 30,000 to 200,000, more preferably, from 40,000 to 150,000, most preferably, from 50,000 to 100,000. The weight average molecular weight of less than 30,000 tends to cause degradation in the strength and flexibility in a film state, and an increase in tackiness; in contrast, the weight average molecular weight exceeding 200,000 tends to cause degradation in the flexibility and adhesiveness in a film state. Here, in the present invention, the weight average molecular weight is obtained based upon values that are measured by the gel permeation chromatography method, and converted by a calibration curve formed by using standard polystyrene.

With respect to the thermosetting resin of (B) component to be used in the present invention, not particularly limited as long as it reacts with an amide group in the skeleton of the modified polyamideimide resin of (A) component through heat or the like, and preferable examples thereof include epoxy resin, phenolic resin, bismaleimide triazine resin and the like. Among these, epoxy resin is preferably used from the viewpoints of good adhesiveness and easiness in handling, and from the viewpoint of non-flammable property, epoxy resin containing phosphor atoms in its molecule is more preferably used. These may be used alone, or two or more kinds of these may be used in combination.

With respect to the above-mentioned epoxy resin, specific examples thereof include: phosphor-containing epoxy resins ZX-1548-1 (phosphor content: 2.0% by weight), ZX-1548-2 (phosphor content: 2.5% by weight), ZX-1548-3 (phosphor content: 3.0% by weight) and ZX-1548-4 (phosphor content: 4.0% by weight) (tradenames, made by Touto Kasei Co., Ltd.), and the like. These may be used alone, or two or more kinds of these may be used in combination.

Moreover, the epoxy equivalent weight of the epoxy resin is preferably set in a range from 200 to 500, more preferably, from 250 to 400.

The blended amount of the thermosetting resin of (B) component is preferably set in a range from 10 to 100 parts by weight, more preferably, from 30 to 80 parts by weight, most preferably, from 20 to 50 parts by weight, with respect to 100 parts by weight of the modified polyamideimide resin of (A) component. The blended amount of less than 10 parts by weight tends to cause an insufficient non-flammable property and degradation in functions as a curing agent, and the blended amount exceeding 100 parts by weight results in a tight cross-linking structure of the resin after having been cured, causing brittleness.

With respect to the thermosetting resin of (B) component to be used in the present invention, it is preferable to use a curing accelerator in addition to the above-mentioned resin.

With respect to the curing accelerator, not particularly limited as long as it reacts with the phosphor-containing epoxy resin of (B) component or accelerates the curing reaction between (A) component and (B) component, examples thereof include amines and imidazoles. These may be used alone or in combination of two or more kinds.

With respect to the above-mentioned amines, examples thereof include dicyandiamide, diaminodiphenyl methane and guanylurea. These may be used alone or in combination of two or more kinds.

With respect to the above-mentioned imidazoles, examples thereof include alkyl-group-substituted imidazole such as 2-ethyl-4-methylimidazole and benzoimidazole. These may be used alone or in combination of two or more kinds.

With respect to the blended amount of the above-mentioned curing accelerator, in the case of the amines, it is preferably set in such a manner that the equivalent weight of the active hydrogen of amine is virtually equal to the epoxy equivalent weight of the phosphor-containing epoxy resin. In the case of the imidazoles, the blended amount thereof is preferably set in a range from 0.1 to 2.0 parts by weight with respect to 100 parts by weight of the phosphor-containing epoxy resin. When the blended amount is too small, uncured phosphor-containing epoxy resin remains, and tends to cause a decrease in the glass transition temperature of the cross-linking resin; in contrast, when the blended amount is too great, uncured curing accelerator remains, and tends to cause degradation in the pot life, insulating property and the like.

With respect to the organic phosphor-based compound of (C) component to be used in the present invention, examples thereof include: biphenyl-type phosphate compounds represented by the above-mentioned formula 7, aromatic condensed phosphate compounds represented by the above-mentioned formula 8, trimethyl phosphate, triethyl phosphate, triphenyl phosphate, tricresyl phosphate, trixylenyl phosphate, cresylphenyl phosphate, cresyldi-2,6-xylenyl phosphate, 2-methacryloyloxy ethyl acid phosphate, diphenyl-2-methacryloyloxy ethyl phosphate, and aromatic condensed phosphate compounds, such as CR-733S, CR-741, CR-747 and PX-200 (trade names, made by Daihachi Chemical Industry Co., Ltd.), SP-703 and SP-601 (trade names, made by Shikoku Corp.), and 35, 50, 65, 95 and 110 of "Leo Phos" Series (trade names, made by Ajinomoto Co., Inc.). These may be used alone or in combination of two or more kinds.

In the above-mentioned formula 7 and formula 8, the benzene ring of the compound may have a substituent such as an alkyl group having carbon atoms of 1 to 5. In the case when two or more of these substituents exist, the two or more substituents may be the same or different from each other.

With respect to the alkyl group having 1 to 5 carbon atoms, examples thereof include: a methyl group, an ethyl group, an n-propyl group, an iso-propyl group, an n-butyl group, an iso-butyl group, a sec-butyl group, a tert-butyl group, a pentyl group, an isopentyl group and a neopentyl group.

The blended amount of the organic phosphor-based compound of the above-mentioned (C) component is preferably set to 2 to 20 parts by weight with respect to 100 parts by weight of a modified polyamideimide resin having a microphase separation structure of component (A), more preferably, 2 to 10 parts by weight, most preferably, 2 to 5 parts by weight. The blended amount of less than 2 parts by weight tends to cause an insufficient non-flammable property, while the blended amount exceeding 20 parts by weight tends to cause degradation in the adhesive property and soldering heat resistance.

The non-flammable heat-resistant resin composition of the present invention, made from the above-mentioned components, is preferably mixed in an organic solvent and prepared as a resin varnish having a solid component content of 20 to 40% by weight, upon storage or upon application. Not particularly limited as long as an appropriate dissolving property is obtained, the above-mentioned organic solvent is, for example, selected from the group consisting of dimethylacetamide, dimethylformamide, dimethylsulfoxide, N-methyl-2-pyrrolidone, γ-butyrolactone, sulforan, cyclohexanone, methylethyl ketone, methyl isobutyl ketone, toluene and acetone.

Moreover, in addition to the above-mentioned respective components, additives, such as a coupling agent, a pigment, a leveling agent, an anti-foamer and an ion-trapping agent, may be appropriately added to the non-flammable heat-resistant resin composition of the present invention, if necessary.

Upon forming an adhesive layer on a subject material by using the non-flammable heat-resistant resin composition of the present invention, for example, the resin composition, as it is, may be applied thereon to form an adhesive layer. Moreover, an adhesive agent film, which has a layer of the non-flammable heat-resistant resin composition formed on a support base member, may be prepared, and the layer of the non-flammable heat-resistant resin composition is laminated on the subject member so that the adhesive layer may be formed. Furthermore, when the adhesive film is used, after the lamination process, the support base member may be removed, or prior to the lamination process, the support base member may be removed.

With respect to the adhesive film having the adhesive layer of the present invention, for example, after the non-flammable heat-resistant resin composition, dissolved in a predetermined organic solvent, has been applied to a support member, the solvent may be dried by heating or hot-air blowing to form the corresponding adhesive film.

With respect to the support member, examples thereof include: resin films made from resins, such as polyolefins like polyethylene and polyvinyl chloride, polyesters like polyethylene terephthalate, polycarbonates, polyimides and Teflon (registered trademark), metal foils such as copper foil and aluminum foil, releasing paper and the like. The thickness of the support member is preferably set in a range from 10 to 150 μm. Here, the support member may be subjected to a matting process or a corona process so as to improve the adhesive property, or may be subjected to a releasing treatment.

With respect to the above-mentioned organic solvent, not particularly limited as long as an appropriate dissolving property is obtained, examples thereof include: ketones such as acetone, methylethyl ketone and methylisobutyl ketone, acetates such as ethyl acetate, butyl acetate, cerosolve acetate, propylene glycol monomethyl acetate and carbitol acetate, cerosolves such as cerosolve and butyl cerosolve, carbitols such as carbitol and butyl carbitol, aromatic hydrocarbons such as toluene and xylene, dimethyl formamide, dimethyl acetamide and N-methyl-2-pyrrolidone. These may be used alone or two or more kinds of these may be used in combination.

The thickness of the non-flammable heat-resistant resin composition laminated on the support member is preferably set in a range from 5 to 50 μm, more preferably, from 10 to 40 μm.

With respect to the product state of the above-mentioned adhesive film, examples thereof include: a sheet shape and a roll shape, which have been cut into a predetermined length, and the like. From the viewpoints of storing property, productivity and workability, a protective film is further laminated on the surface that is not made in contact with the support member of the adhesive layer, and this is preferably taken up into a roll shape and stored.

With respect to the protective film, in the same manner as the support member, examples thereof include: films made from resins, such as polyolefins like polyethylene and polyvinyl chloride, polyesters like polyethylene terephthalate, polycarbonates, Teflon (registered trademark), and releasing paper. The thickness of the protective film is preferably set in a range from 10 to 100 μm. Here, the protective film may be subjected to a matting process, a corona process or a releasing treatment.

An adhesive layer made from the non-flammable heat-resistant resin composition of the present invention is laminated on, for example, a polyimide film serving as a support member so that a polyimide film with an adhesive agent is formed; thus, it is possible to provide, for example, a flexible circuit board-use cover-lay film and a base film. Moreover, by laminating a metal foil thereon, it is also possible to provide a flexible circuit board-use substrate and the like.

EXAMPLES

The following description will discuss the present invention in more detail by means of examples; however, these examples are intended to be illustrative only and are not intended to limit the scope of the present invention.

Synthesis Example of (A) Modified Polyimide Resin

To a separable flask (1 Liter) equipped with a water quantitative receiver (25 ml) with a cock connected to a reflux condenser, a thermometer and a stirrer were loaded BAPP (2,2-bis[4-(4-aminophenoxy)phenyl]propane) serving as diamine having three or more aromatic rings, Jeffermine D-2000 (trade name, made by Sun Technochmical Co., Ltd., amine equivalent weight: 1000 g/mol) serving as polyoxypropylene diamine, reactive silicone oil X-22-161B (trade name, made by Shin-Etsu Chemical Co., Ltd., amine equivalent weight: 1540 g/mol) serving as siloxane diamine, TMA (trimellitic anhydride), NMP (N-methyl-2-pyrrolidone) serving as a non-protic solvent and γ-BL (γ-butyrolactone), respectively at ratios of blend as shown in Table 1, and were stirred at 80° C. for 30 minutes. To this was further added 100 ml of toluene serving as aromatic hydrocarbon capable of azeotropic distillation with water, and this was then heated and subjected to a reflux process at about 160° C. for 2 hours.

After having confirmed that about not less than 3.6 ml of water was stored in the water quantitative receiver and that there was no water flow, the system was heated to about 190° C. to remove toluene, while the released water, stored in the water quantitative receiver, was being removed.

Thereafter, the solution was cooled to room temperature, and to this were added terephthalic acid serving as aromatic dicarboxylic acid and MDI (4,4'-diphenyl methane diisocyanate) and TDI (2,4-tolylenediisocyanate), serving as aromatic diisocyanate, at added amounts shown in Table 1, and this was allowed to react at 190° C. for 2 hours. After completion of the reaction, NMP/γ-BL solutions A-1 to A-4, which were modified polyamideimide resins, were obtained.

TABLE 1

| | Blended Amounts (Parts by weight) | | | |
|---|---|---|---|---|
| Items | A-1 | A-2 | A-3 | A-4 |
| BAPP | 38.3 | 34.3 | 25.7 | 1.5 |
| Jeffermine D-2000 | 72.6 | 90.0 | 125.0 | 90.0 |
| X-22-161B | 63.1 | 66.2 | 77.0 | 81.4 |
| TMA | 60.5 | 60.5 | 60.5 | 30.2 |
| NMP | 271.0 | 288.0 | 287.0 | 246.0 |
| γ-BL | 271.0 | 288.0 | 287.0 | 246.0 |
| Terephthalic Acid | 0 | 0 | 0 | 14.4 |
| MDI | 27.0 | 27.0 | 27.0 | 27.0 |
| TDI | 12.5 | 12.5 | 12.5 | 12.5 |
| Nonvolatile contents (weight %) | 32.0 | 32.0 | 32.0 | 32.0 |
| Weight-average molecular weight | 85000 | 80000 | 75000 | 75000 |

Examples 1 to 3 and Comparative Example 1

Each of materials shown in Table 2 was blended to each of the modified polyamideimide resin solutions (A-1 to A-4) obtained through the above-mentioned synthesis example, and after this had been stirred for about 1 hour until the resin was evenly dispersed, this was allowed to stand still at room temperature for 24 hours for defoaming to obtain a resin composition.

The resulting resin composition was applied onto a polyimide film (Capton 100H: trade name, made by Toray-Du Pont Co., Ltd.) having a thickness of 25 μm so as to form a film thickness of 20 μm after the drying process, and this was dried at 130° C. for 10 minutes, and on this was further laminated the roughened surface side of a rolled copper foil (BHY-22B-T: trade name, made by Nikko Glued Foil Co., Ltd.) having a thickness of 35 μm, and this was provisionally bonded through a thermal roll laminating process at a temperature of 140° C. under a pressure of 0.5 MPa, and cured at 160° C. for 120 minutes by a dryer; thus, a sample was prepared (Sample A).

Moreover, the resulting resin composition was applied onto a polyimide film (Capton 100H: trade name, made by Toray-Du Pont Co., Ltd.) having a thickness of 25 μm so as to form a film thickness of 20 μm after the drying process, and this was dried at 130° C. for 10 minutes, and on this was further laminated the gloss surface side of a rolled copper foil (BHY-22B-T: brand name, made by Nikko Glued Foil Co., Ltd.) having a thickness of 35 μm, and this was provisionally bonded through a thermal roll laminating process at a temperature of 140° C. under a pressure of 0.5 MPa, and cured at 160° C. for 120 minutes by a dryer; thus, a sample was prepared (Sample B).

Furthermore, the resulting resin composition was applied onto a polyimide film (Capton 100H: trade name, made by Toray-Du Pont Co., Ltd.) having a thickness of 25 μm so as to form a film thickness of 20 μm after the drying process, and this was dried at 130° C. for 10 minutes, and the resulting film was cured at 160° C. for 120 minutes by a dryer; thus, a sample was prepared (Sample C).

The resulting resin composition was applied onto a Teflon (registered trademark) film (Nafron Tape TOMBO9001, trade name, made by Nichiasu K. K.) having a thickness of 50 μm so as to form a film thickness of 20 μm after the drying process, and this was dried at 130° C. for 10 minutes, and the resulting film was cured at 160° C. for 120 minutes by a dryer; thus, a cured film with a Teflon (registered trademark) film was obtained, and the Teflon (registered trademark) film was separated therefrom to prepare a sample (Sample D).

Further, the resulting resin composition was applied onto a polyimide film (Capton 100H: trade name, made by Toray-Du Pont Co., Ltd.) having a thickness of 25 μm so as to form a film thickness of 25 μm after the drying process, and this was dried at 130° C. for 10 minutes; thus, a sample was prepared (Sample E).

Moreover, the resulting resin composition was applied onto a Teflon (registered trademark) film (Nafron Tape TOMBO9001, trade name, made by Nichiasu K. K.) having a thickness of 50 μm so as to form a film thickness of 25 μm after the drying process, and this was dried at 130° C. for 10 minutes, and the Teflon (registered trademark) film was separated from the resulting film to prepare a sample (Sample F).

TABLE 2

| | Items | Blended Amounts (Parts by weight) Examples 1 | 2 | 3 | 4 | Comparative Example 1 |
|---|---|---|---|---|---|---|
| (A) Component | Modified polyamideimide resin solution (A-1) Solid component 32% by weight | 219 | | | | |
| | Modified polyamideimide resin solution (A-2) Solid component 32% by weight | | 219 | | | |
| | Modified polyamideimide resin solution (A-3) Solid component 32% by weight | | | 219 | | |
| | Modified polyamideimide resin solution (A-4) Solid component 32% by weight | | | | 219 | |
| (B) Component | Phosphor-containing epoxy resin: ZX-1548-2*[1] | 30 | 30 | 30 | 30 | 70 |
| (C) Component | Biphenyl-type phosphate: CR-747*[2] | 5 | 5 | 5 | 5 | 8 |
| Other components | Dicyan amide | 0.15 | 0.15 | 0.15 | 0.15 | |
| | 2-ethyl-4-methyl imidazole | 0.2 | 0.2 | 0.2 | 0.2 | 0.2 |
| | Phenol novolak resin: TD2131*[3] | | | | | 30 |
| | Triphenyl phosphine | | | | | 1 |

*[1]Trade name made by Touto Kasei Co., Ltd.
*[2]Trade name made by Daihachi Chemical Industry Co., Ltd.
*[3]Trade name made by Daicel Chemical Industries, Ltd.

By using these samples, measurements were carried out on the following properties: adhesiveness (Samples A and B), solder heat resistance (Sample A), non-flammable property (Sample C), coefficient of thermal expansion (Sample D), glass transition temperature (Sample D), storage elastic modulus (Sample D), warping after drying (Sample E) and residual solvent (Sample F), and the results are shown in Table 3. Measuring methods and conditions of these characteristics are shown below:

(Adhesiveness)

Peeling tests were carried out on sample A (sample structure: polyimide film/resin composition/rolled copper foil roughened surface) and sample B (sample structure: polyimide film/resin composition/rolled copper foil gloss surface) by drawing the rolled copper foil in 90° direction under the following conditions; thus, the peel strength (kN/m) was measured between the rolled copper foil roughened surface and the polyimide film as well as between the rolled copper foil gloss surface and the polyimide film.

Measuring temperature: 25° C., Peeling speed: 50 mm/min (Solder Heat Resistance)

Sample A (sample structure: polyimide film/resin composition/rolled copper foil roughened surface) was immersed into a solder bath of 300° C. for 3 minutes, and examined for any abnormal external appearances such as swelling and peeling.

○: There were no abnormal external appearances such as swelling and peeling.

X: There were abnormal external appearances such as swelling and peeling.

(Non-flammable Property)

Sample C (sample structure: polyimide film/resin composition) was subjected to measurements for non-flammable property grade in compliance with UL94 non-flammable property standard.

(Glass Transition Temperature and Storage Elastic Modulus)

Sample D (sample structure: only cured film) was subjected to dynamic viscoelasticity measurements by using an RSA-II (trade name, made by Leometric Co., Ltd.) under the following conditions. With respect to the glass transition temperature (Tg), the maximum value of tan δ peak was used.

Measuring mode: Peeling chuck-to-chuck distance: 22.5 mm, Measuring temperature: −50 to 300° C., Temperature rise rate: 5° C./min, Measuring frequency: 10 Hz, Sample size: 5 mm width×20 mm length.

(Coefficient of Thermal Expansion)

Sample D (sample structure: only cured film) was subjected to measurements for coefficient of thermal expansion under the following conditions. Here, the value of coefficient of thermal expansion in a range from 0° C. to <Tg was set to $\alpha_1$ and the value of coefficient of thermal expansion in a range from Tg< to 300° C. was set to $\alpha_2$.

Measuring device: TMA (made by Seiko Instruments Inc.)

Measuring modes: Peeling measurement temperature: 0 to 300° C., Temperature rise rate: 5° C./min.

(Warping after Drying)

Sample E (sample structure: polyimide film/resin composition) was placed on a horizontal plane, and the height of warping of the sample was measured.

○: There was no warping (height: 0 mm)

Δ: There was slight warping (height<10 mm)

X: There was warping (height>10 mm in a curled shape)

(Residual Solvent)

Sample F (sample structure: only dried film) was cut into a predetermined area, and the weight thereof was measured (W0). This was dried at 200° C. for one hour (W1). The residual solvent was calculated based upon the following equation.

$$\text{Residual solvent } (\%)=(w0-w1)/w0\times 100$$

TABLE 3

| Items | | Examples 1 | 2 | 3 | 4 | Comparative Example 1 |
|---|---|---|---|---|---|---|
| Warping after drying | | ○ | ○ | ○ | ○ | X |
| Non-flammable property (UL 94) | | V-0 | V-0 | V-0 | V-0 | V-0 |
| Adhesiveness (KN/m) | Rolled copper foil Roughened surface | 1.3 | 1.4 | 1.4 | 1.3 | 0.9 |
| | Rolled copper foil Gloss surface | 1.2 | 1.4 | 1.4 | 1.3 | 0.4 |
| | Polyimide film | 1.8 | 1.9 | 1.9 | 1.8 | 0.2 |
| Set temperature (° C.) | Tg | 180 | 170 | 160 | 150 | 130 |
| | Tg1 (<Tg) | 25 | 25 | 25 | 25 | 25 |
| | Tg2 (>Tg) | 250 | 250 | 250 | 250 | 250 |
| Storage elastic modulus (Mpa) | E1 (<Tg) | 400 | 250 | 100 | 600 | 83 |
| | E2 (>Tg) | 0.05 | 0.02 | 0.01 | 50 | 0.001 |
| Coefficient of thermal expansion ($\times 10^{-3}$/K) | α1 (<Tg) | 0.21 | 0.3 | 4.0 | 0.2 | 10.0 |
| | α2 (>Tg) | 4.0 | 2.5 | 2.0 | 0.13 | 50.0 |
| Internal stress (MPa) | | 13.0 | 10.9 | 5.4 | 17.9 | 87.2 |
| Solder heat resistance (300° C.) | | ○ | ○ | ○ | ○ | X |
| Residual solvent (%) | | 0.5 | 0.5 | 0.5 | 0.6 | 10.5 |

The non-flammable heat-resistant resin composition of the present invention have superior properties such as a superior thermal-stress reducing effect derived from a polyoxypropylene unit and a siloxane unit of modified polyamideimide resin, a non-flammable property derived from an aromatic unit and a siloxane unit of modified polyamideimide resin, a superior halogen-free non-flammable property derived from a phosphor-based compound serving as a non-flammable assistant agent and a superior adhesive property derived from a stress-alleviating function of a micro phase separation structure of modified polyamideimide resin; thus, this resin composition is effectively used as adhesives for various printed circuit boards, adhesive films and the like.

Moreover, the adhesive film of the present invention exerts a superior thermal-stress reducing effect derived from a polyoxypropylene unit and a siloxane unit of modified polyamideimide resin, a non-flammable effect derived from an aromatic unit and a siloxane unit of modified polyamideimide resin, a superior halogen-free non-flammable effect derived from a phosphor-based compound serving as a non-flammable assistant agent and a superior adhesive property derived from a stress-alleviating function of a micro phase separation structure of modified polyamideimide resin.

The polyimide film with the adhesive of the present invention exerts a superior thermal-stress reducing effect derived from a polyoxypropylene unit and a siloxane unit of modified polyamideimide resin, a non-flammable effect derived from an aromatic unit and a siloxane unit of modified polyamideimide resin, a superior halogen-free non-flammable effect derived from a phosphor-based compound serving as a non-flammable assistant agent and a superior adhesive property derived from a stress-alleviating function of a micro phase separation structure of modified polyamideimide resin.

While the invention has been described in detail with reference to specific examples thereof, it will be apparent to one skilled in the art that various changes and modifications can be made therein without departing from the spirit and scope thereof.

The invention claimed is:

1. A non-flammable heat-resistant resin composition, comprising:

(A) modified polyamideimide resin, (B) thermosetting resin and (C) organic phosphorus-based compound, wherein a cured film, obtained from the non-flammable heat-resistant resin composition, exerts a storage elastic modulus of 700 MPa or less, a coefficient of thermal expansion of $5\times10^{-3}$/K or less and an internal stress of 20 MPa or less, in a temperature range of 25 to 250° C., and wherein the (A) modified polyamideimide resin is a modified polyamideimide resin that is obtained by allowing a mixture containing diimide dicarboxylic acid, represented by the following formula 1, formula 2 and formula 3 obtained through a reaction between a mixture of diamine having three or more aromatic rings, polyoxypropylene diamine and siloxane diamine, and trimellitic anhydride;

(Formula 1)

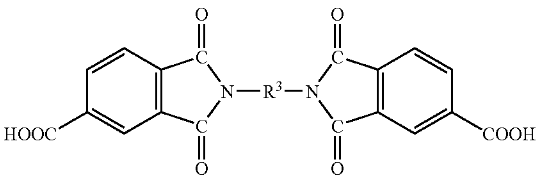

[in the formula, $R^1$ represents:

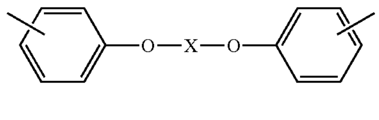

(where X represents

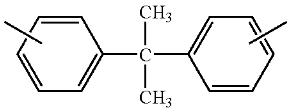
,
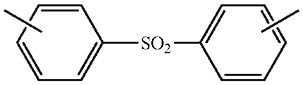
,
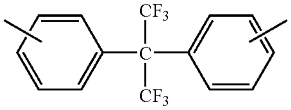
,
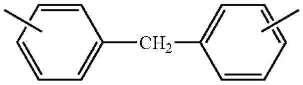
,
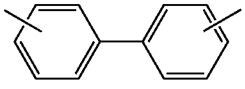
,
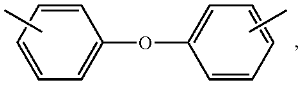
,
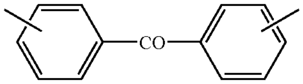
or
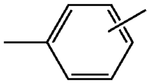
)]

(Formula 2)

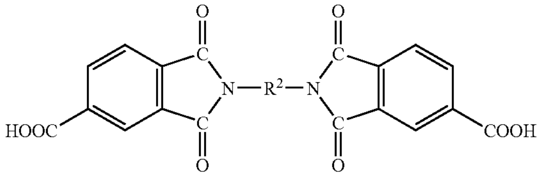

[in the formula, $R^2$ represents:

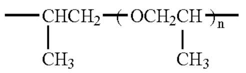

(where n represents an integer of 1 to 70),]

(Formula 3)

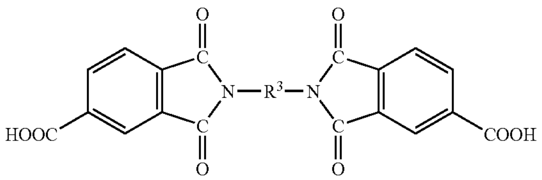

[in the formula, $R^3$ represents:

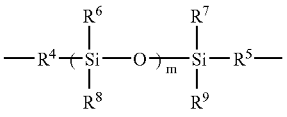

(where $R^4$ and $R^5$ independently represent divalent organic groups, each of $R^6$ to $R^9$ independently represents an alkyl group having 1 to 20 carbon atoms or an aryl group having 6 to 18 carbon atoms, and m represents an integer of 1 to 50)] and aromatic dicarboxylic acid, represented by the following formula 4, to coexist;

$$HOOC—R^{10}—COOH \quad \text{(Formula 4)}$$

[in the formula, $R^{10}$ represents:

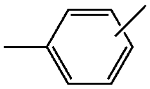
,
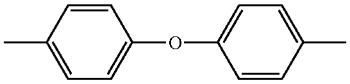
,
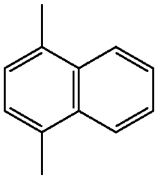
,
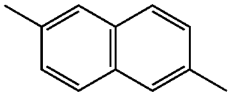
]

and by also allowing aromatic diisocyanate, represented by the following formula 5, to react with the mixture $$NCO—R^{11}—NCO \quad \text{(Formula 5)}$$

[in the formula, $R^{11}$ represents:

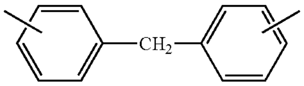

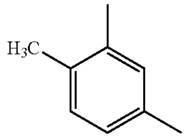

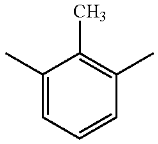

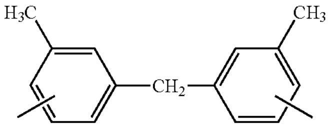
or
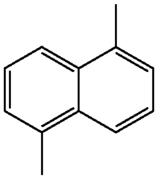
].

2. The non-flammable heat-resistant resin composition according to claim 1, wherein: (A) modified polyamideimide resin is synthesized in the presence of a non-protic polar solvent, and resin varnish containing the solvent is dried at 120 to 140° for 5 to 15 minutes so that the content of the non-protic polar solvent becomes 1% or less.

3. The non-flammable heat-resistant resin composition according to claim 2, which contains 10 to 100 parts by weight of (B) thermosetting resin and 2 to 20 parts by weight of (C) organic phosphorus-based compound, with respect to 100 parts by weight of (A) modified polyamideimide resin.

4. The non-flammable heat-resistant resin composition according to claim 2, wherein (A) modified polyamideimide resin is synthesized in the presence of a basic catalyst.

5. The non-flammable heat-resistant resin composition according to claim 2, wherein (B) thermosetting resin is made from an epoxy resin and a curing accelerator thereof or a curing agent thereof.

6. The non-flammable heat-resistant resin composition according to claim 2, wherein (C) organic phosphorus-based compound is a phosphate-based compound represented by the following formula 7, (Formula 7)

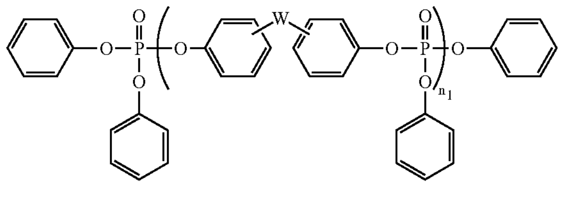

(in the formula, W represents a single bond, or a bonding group, —S—, —$SO_2$—, —O—, or —N═N—, and $n_1$ is an integer of 10 to 50)

or a phosphate-based compound represented by the following formula 8

(Formula 8)

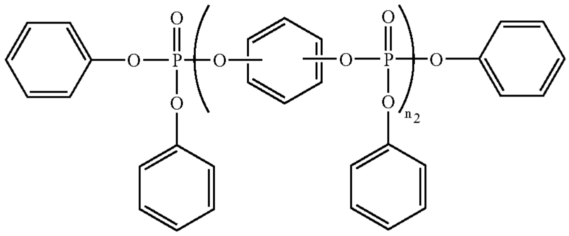

(in the formula, $n_2$ is an integer of 10 to 50).

7. The non-flammable heat-resistant resin composition according to claim 6, wherein said bonding group represented by W in Formula 7 is an alkylene group having 1 to 5 carbon atoms.

8. An adhesive film comprising at least a non-flammable heat-resistant resin composition disclosed in claim 2 and a support member for supporting the resin composition.

9. The non-flammable heat-resistant resin composition according to claim 1, which contains 10 to 100 parts by weight of (B) thermosetting resin and 2 to 20 parts by weight of (C) organic phosphorus-based compound, with respect to 100 parts by weight of (A) modified polyamideimide resin.

10. The non-flammable heat-resistant resin composition according to claim 9, wherein (A) modified polyamideimide resin is synthesized in the presence of a basic catalyst.

11. The non-flammable heat-resistant resin composition according to claim 9, wherein (B) thermosetting resin is made from an epoxy resin and a curing accelerator thereof or a curing agent thereof.

12. The non-flammable heat-resistant resin composition according to claim 9, wherein (C) organic phosphorus-based compound is a phosphate-based compound represented by the following formula 7, (Formula 7)

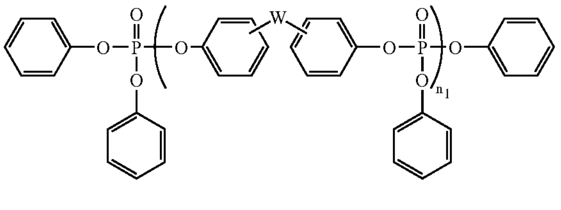

(in the formula, W represents a single bond, or a bonding group, —S—, —$SO_2$—, —O—, or —N═N—, and $n_1$ is an integer of 10 to 50)

or a phosphate-based compound represented by the following formula 8

(Formula 8)

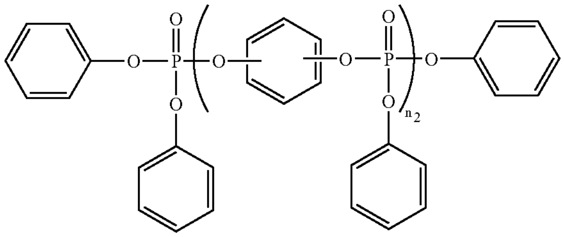

(in the formula, $n_2$ is an integer of 10 to 50).

13. The non-flammable heat-resistant resin composition according to claim 12, wherein said bonding group represented by W in Formula 7 is an alkylene group having 1 to 5 carbon atoms.

14. An adhesive film comprising at least a non-flammable heat-resistant resin composition disclosed in claim 9 and a support member for supporting the resin composition.

15. The non-flammable heat-resistant resin composition according to claim 1, wherein the polyoxypropylene diamine has an amine equivalent weight in a range from 100 to 2,000 g/mol.

16. The non-flammable heat-resistant resin composition according to claim 1, wherein the siloxane diamine has an amine equivalent weight in a range from 400 to 2,500 g/mol.

17. The non-flammable heat-resistant resin composition according to claim 1, wherein (A) modified polyamideimide resin is synthesized in the presence of a basic catalyst.

18. The non-flammable heat-resistant resin composition according to claim 17, wherein the basic catalyst is trialkyl amine represented by the following formula 6

(Formula 6)

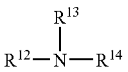

(in the formula, each of $R^{12}$ to $R^{14}$ represents an alkyl group having 1 to 8 carbon atoms).

19. The non-flammable heat-resistant resin composition according to claim 1, wherein (B) thermosetting resin is made from an epoxy resin and a curing accelerator thereof or a curing agent thereof.

20. The non-flammable heat-resistant resin composition according to claim 19, wherein the epoxy resin is a phosphorus-containing epoxy resin.

21. The non-flammable heat-resistant resin composition according to claim 1, wherein (C) organic phosphorus-based compound is a phosphate-based compound represented by the following formula 7, (Formula 7)

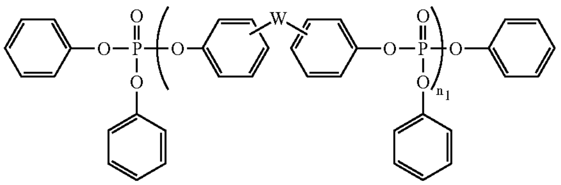

(in the formula, W represents a single bond, or a bonding group, —S—, —$SO_2$—, —O—, or —N═N—, and $n_1$ is an integer of 10 to 50)

or a phosphate-based compound represented by the following formula 8

(Formula 8)

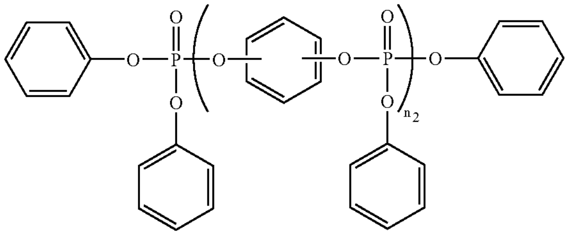

(in the formula, $n_2$ is an integer of 10 to 50).

22. The non-flammable heat-resistant resin composition according to claim 21, wherein said bonding group represented by W in Formula 7 is an alkylene group having 1 to 5 carbon atoms.

23. An adhesive film comprising at least a non-flammable heat-resistant resin composition disclosed in claim 1 and a support member for supporting the resin composition.

24. The adhesive film according to claim 23, wherein the support member is a polyimide film.

* * * * *